US 6,926,378 B2

(12) United States Patent
Greenwald et al.

(10) Patent No.: US 6,926,378 B2
(45) Date of Patent: Aug. 9, 2005

(54) SUPPORT SYSTEM FOR TELESCOPING SLIDE ASSEMBLY (75) Inventors: William B. Greenwald, Beech Grove, IN (US); Richard C. Evans, Shelbyville, IN (US); Kerry D. Heath, Indianapolis, IN (US); Phillip B. Cutler, Westfield, IN (US)

(73) Assignee: General Devices Co., Inc., Indianapolis, IN (US)

( * ) Notice: Subject to any disclaimer, the term of this patent is extended or adjusted under 35 U.S.C. 154(b) by 13 days.

(21) Appl. No.: 10/641,743

(22) Filed: Aug. 15, 2003

(65) Prior Publication Data

US 2004/0089779 A1 May 13, 2004

Related U.S. Application Data

(60) Provisional application No. 60/403,850, filed on Aug. 15, 2002.

(51) Int. Cl.$^7$ ............................................. A47B 88/00
(52) U.S. Cl. .................. 312/334.4; 312/223.1
(58) Field of Search ........................ 312/223.1, 334.4, 312/334.5, 265.4, 265.1, 334.7, 334.8, 350; 211/26, 182; 411/175, 174, 111, 112; 361/725, 726, 727, 683; 248/220.22, 221.11, 220.41, 220.43

(56) References Cited

U.S. PATENT DOCUMENTS

| | | | |
|---|---|---|---|
| 516,583 A | 3/1894 | Adkins | |
| 1,698,252 A | 1/1929 | Ashe | |
| 2,394,729 A | * 2/1946 | Tinnerman | ................. 411/112 |
| 2,644,588 A | 7/1953 | Brown | |
| 2,749,200 A | 6/1956 | Kuss | |
| 2,809,086 A | 10/1957 | Fall | |
| 3,054,511 A | 9/1962 | Erismann | |
| 3,133,768 A | 5/1964 | Klakovich | |
| 4,423,914 A | 1/1984 | Vander Ley | |
| 4,441,772 A | 4/1984 | Fielding et al. | |
| 4,474,492 A | 10/1984 | Fleitas | |
| 5,063,715 A | 11/1991 | Goodman | |
| 5,199,777 A | 4/1993 | Taima et al. | |
| 5,292,198 A | 3/1994 | Rock et al. | |
| 5,405,195 A | 4/1995 | Hobbs | |
| 5,433,517 A | 7/1995 | Fleisch | |
| 5,580,138 A | 12/1996 | Grabher | |
| 5,620,244 A | 4/1997 | Yang | |
| 5,632,542 A | 5/1997 | Krivec | |
| 5,671,988 A | 9/1997 | O'Neill | |
| 5,683,159 A | 11/1997 | Johnson | |
| 5,730,514 A | 3/1998 | Hashemi | |
| 5,791,498 A | * 8/1998 | Mills | ........................... 211/26 |
| 5,823,648 A | 10/1998 | Domenig | |
| 5,904,412 A | 5/1999 | Lammens | |
| 6,027,194 A | 2/2000 | Fleisch | |
| 6,095,345 A | * 8/2000 | Gibbons | ....................... 211/26 |
| 6,209,979 B1 | 4/2001 | Fall et al. | |
| 6,230,903 B1 | * 5/2001 | Abbott | ....................... 211/26 |
| 6,273,534 B1 | 8/2001 | Bueley et al. | |
| 6,398,041 B1 | * 6/2002 | Abbott | ....................... 211/26 |
| 6,422,399 B1 | 7/2002 | Castillo et al. | |
| 6,450,747 B1 | * 9/2002 | Fischer | ....................... 411/174 |
| 6,681,942 B2 | * 1/2004 | Haney | ....................... 211/183 |
| 6,746,193 B1 | * 6/2004 | Drake | ....................... 411/175 |
| 6,749,275 B2 | * 6/2004 | Cutler et al. | ............. 312/334.4 |
| 2004/0094492 A1 | * 5/2004 | Greenwald et al. | ........... 211/26 |

FOREIGN PATENT DOCUMENTS

CA 817754 7/1969

* cited by examiner

*Primary Examiner*—Janet M. Wilkens
(74) *Attorney, Agent, or Firm*—Barnes & Thornburg LLP (57) ABSTRACT

A telescoping slide assembly support system includes a stationary slide and a slide support coupled to the stationary slide and to a rack included in an equipment cabinet.

29 Claims, 6 Drawing Sheets

SUPPORT SYSTEM FOR TELESCOPING SLIDE ASSEMBLY

This application claims priority under 35 U.S.C. § 119(e) to U.S. Provisional Application Ser. No. 60/403,850, filed Aug. 15, 2002, which is expressly incorporated by reference herein.

BACKGROUND

The present disclosure relates to telescoping slide assemblies, and particularly to telescoping slide assemblies mounted on racks to support a piece of equipment for movement relative to the rack. More particularly, the present disclosure relates to bracket systems for mounting telescoping slide assemblies on racks included in an equipment cabinet.

SUMMARY

A telescoping slide assembly support system in accordance with the present disclosure comprises a telescoping slide assembly, a rack for use in an equipment cabinet, and an adaptor for the telescoping slide assembly. The telescoping slide assembly is configured to be coupled quickly and easily to the vertical rack using the adaptor to facilitate mounting the stationary slide included in the telescoping slide assembly in a fixed position relative to the rack. A load-carrying slide also included in the telescoping slide can be coupled to a piece of equipment to support that equipment for movement relative to the vertical rack first into and out of the equipment cabinet.

The adaptor is configured to enable a user to couple the telescoping slide assembly to a rack formed, for example, to include a series of square-shaped or rectangle-shaped retainer apertures. The adaptor is "clipped" or otherwise mounted on the rack. The adaptor is shaped to mate, for example, with square-shaped or rectangle-shaped retainer apertures formed in the rack. The adaptor is formed to include apertures to permit various fixed and movable retainers included in the telescoping slide assembly to extend through the adaptor and into retainer apertures formed in the rack to allow the telescoping slide assembly to mate with the rack.

In an illustrative embodiment, the telescoping slide assembly includes a slide support coupled to a stationary slide and formed to include a fixed retainer adapted to extend into a first retainer receiver formed in the adaptor. The slide support further includes a movable retainer adapted to extend into a second retainer receiver formed in the adaptor. The movable and fixed retainers cooperate to couple the slide support and the stationary slide to the adaptor and the rack to support the telescoping slide assembly in a mounted position ion the rack.

The slide support further includes a movable actuator supported on an anchor mount for movement about a central axis established by the anchor mount. The movable actuator is configured to move relative to the anchor mount so as to move the movable retainer toward and away from the fixed retainer, at the option of a user gripping and manipulating the actuator. In an illustrative embodiment, the retainers are coupled to the adaptor and rack by moving the movable retainer toward the fixed retainer to a "lowered" position, inserting the fixed retainer into the first retainer receiver formed in the adaptor and inserting the lowered movable retainer into the second retainer receiver formed in the adaptor, and then moving the movable retainer away from the fixed retainer to a "raised" position to mate the retainers to the adaptor and the rack.

Features of the present disclosure will become apparent to those skilled in the art upon consideration of the following detailed description of illustrative embodiments exemplifying the best mode of carrying out the disclosure as presently perceived.

BRIEF DESCRIPTION OF THE DRAWINGS

The detailed description particularly refers to the accompanying figures in which.

DETAILED DESCRIPTION

Figure 1:
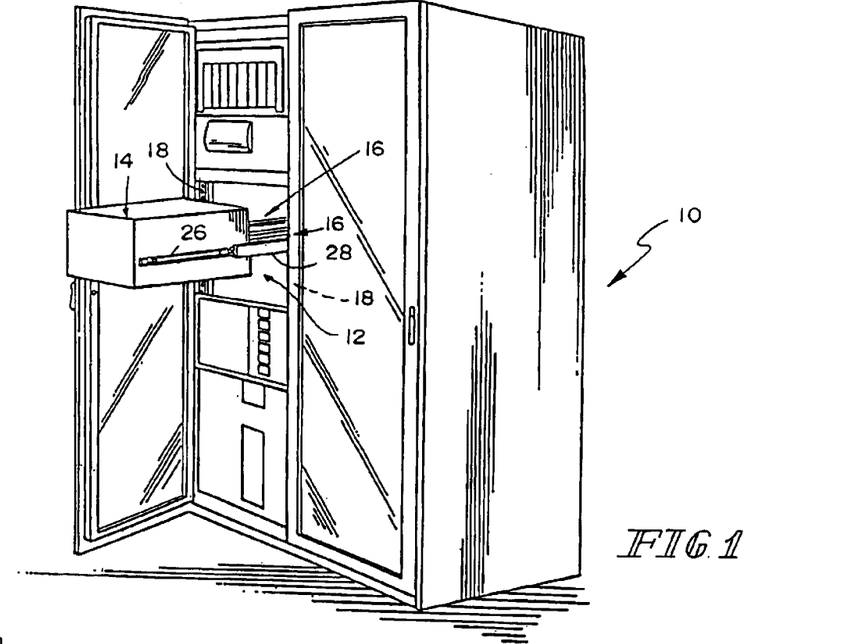
FIG. 1 is a perspective view showing a piece of equipment mounted on two fully extended telescoping slide assemblies that are mounted on vertical racks provided inside a cabinet to enable a technician to move the piece of equipment easily into and out of the cabinet.
Figure 2:
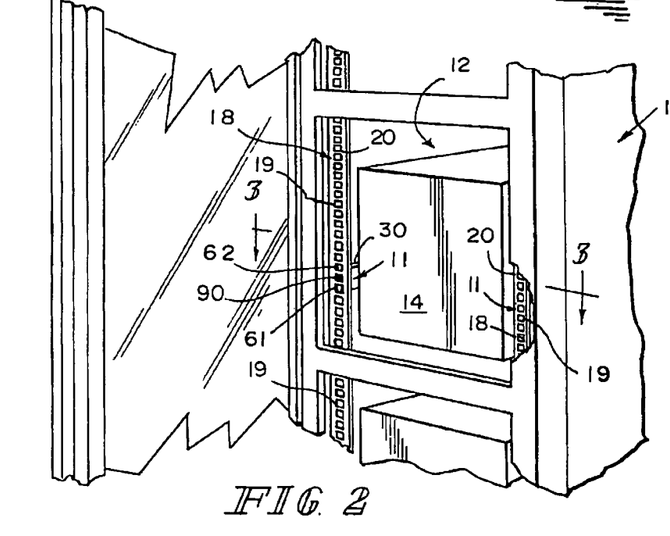
FIG. 2 is a partial perspective view of the cabinet of FIG. 1, with portions broken away, showing the piece of equipment located inside the cabinet owing to the full retraction of the telescoping slide assemblies inside the cabinet and showing two forward vertical racks and a series of square-shaped retainer apertures formed in each of the forward vertical racks.
Figure 2A:
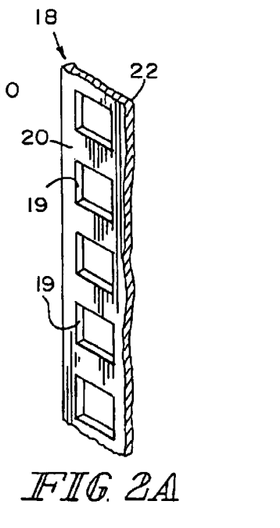
FIG. 2A is an enlarged partial perspective view of a portion of the left-side forward vertical rack shown in FIGS. 1 and 2 showing the "square shape" of each retainer aperture formed in the left-side forward vertical rack.

An equipment cabinet 10 includes an interior region 12 adapted to store equipment therein as shown, for example, in FIGS. 1 and 2. A piece of equipment 14 is mounted on a pair of spaced-apart telescoping slide assemblies 16 for movement thereon between a fully extended position away from cabinet 10 as shown in FIG. 1 and a fully retracted position within cabinet 10 as shown in FIG. 2. Vertical racks 18 are mounted in cabinet 10 as shown, for example, in FIGS. 1–3 and telescoping slide assemblies 16 are mounted to these vertical racks 18 using adaptors 13 shown, for example, in FIGS. 4–12.

Each vertical rack 18 includes a forwardly facing surface 20, a rearwardly facing surface 22, and a series of retainer apertures 19, as shown, for example, in FIGS. 2A, 4, and 9–12. Each rack 18 is coupled to equipment cabinet 10 and positioned to lie in interior region 12 as shown, for example, in FIG. 3. It is within the scope of this disclosure to configure and orient rack 18 to support slide assemblies in a wide variety of locations within cabinet 10. In many instances, rack 18 will have a "vertical" orientation but other orientations fall within the scope of this disclosure.

In the illustrated embodiment, each retainer aperture 19 formed in rack 18 is square-shaped. Adaptor 13 is configured to be mounted on rack 18 as suggested, for example, in FIGS. 11 and 12 to reduce the size of the retainer lug-receiving openings defined by retainer apertures 19 to a size that is adapted to "match" more closely the size of a retainer lug (e.g., retainer lugs 61, 62) provided to couple a telescoping slide assembly 16 to rack 18. In the illustrated embodiment, retainer lugs 61, 62 are included in a slide support 11 that is coupled to a stationary slide 30 included in telescoping slide assembly 16.

Adaptor 13 is used to allow a technician to couple a telescoping slide assembly 16 to a rack 18 even though the assembly 16 includes retainer lugs that are not shaped to match the shape of the lug-receiving openings provided by retainer apertures 19 formed in rack 18. In the illustrated embodiment, non-square retainer lugs 61, 62 included in telescoping slide assembly 16 are "anchored" in square-shaped retainer apertures 19 using adaptor 13. These retainer lugs 61, 62 are smaller in size than the openings provided by retainer apertures 19 formed in rack 18.

Telescoping slide assembly 16 includes any suitable number of slides. In the illustrations, telescoping slide assembly 16 includes interconnected load-carrying slide 26, intermediate slide 28, and stationary slide 30. These slides 26, 28, and 30 are movable relative to one another to extend and retract load-carrying slide 26 relative to stationary slide 30 between fully extended and retracted positions as suggested in FIGS. 1 and 2. Piece of equipment 14 is coupled to spaced-apart load-carrying slides 26 in any suitable manner as shown, for example, in FIG. 3. It is within the scope of this disclosure to omit intermediate slide 28 or add additional intermediate slides (not shown).

A slide support 11 is provided in each telescoping slide assembly 16 so that each end of each stationary slide 30 can be mounted to an adjacent rack 18 and the adaptor 13 mounted on rack 18 quickly and easily. Thus, the telescoping slide assemblies 16 used to support equipment 14 are positioned to lie in spaced-apart parallel relation to one another in fixed positions on racks 18. A slide support 11 of the type shown, for example, in FIGS. 11–15, can be operated quickly and easily by a technician provided with access to interior region 12 of equipment cabinet 10 to couple stationary slide 30 of telescoping slide assembly 16 to rack 18 and adaptor 13 as shown in FIGS. 12–15.

Figure 11:
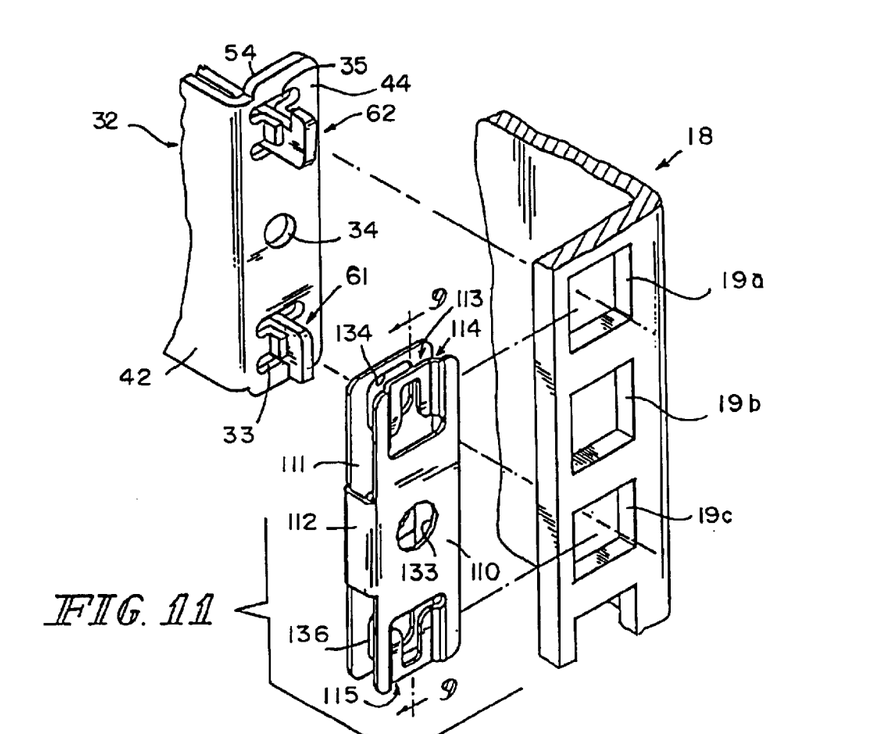
FIG. 11 is a perspective view of the adaptor of FIG. 4 before the adaptor is mounted on a rack.
Figure 12:
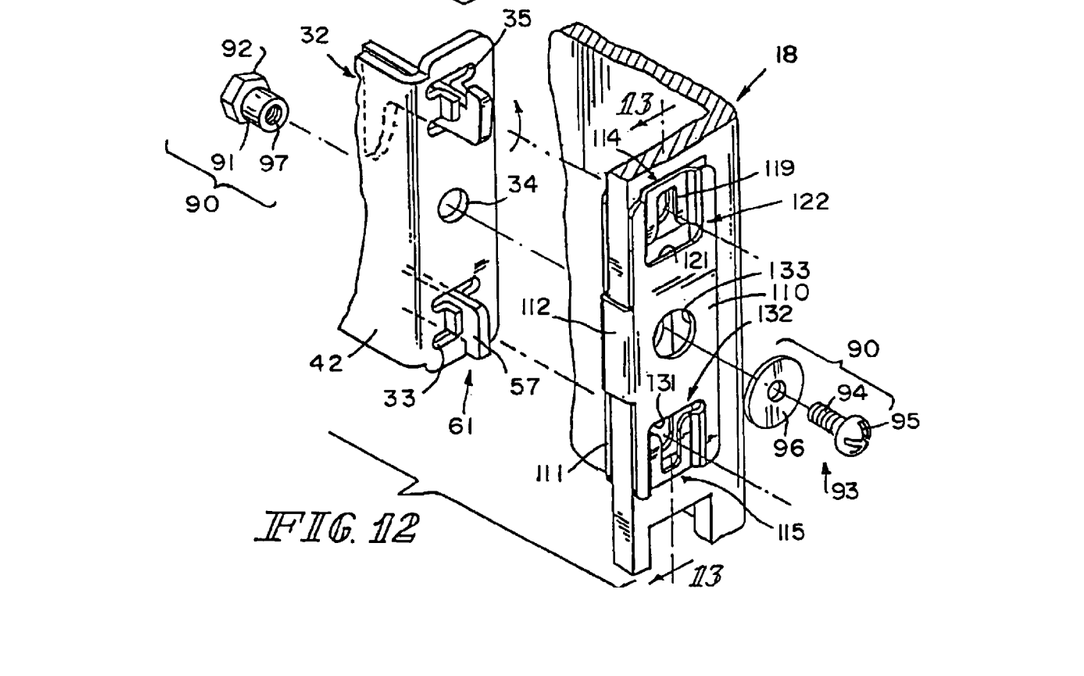
FIG. 12 is a view similar to FIG. 11 after the adaptor has been mounted on the rack to reduce the effective size of the openings provided by two of the square-shaped apertures formed in the rack.

Adaptor 13 is configured to occlude a portion of at least one of retainer apertures 19 formed in rack 18 when adaptor 13 is coupled to rack 18, as suggested, for example, in FIGS. 11 and 12. Such occlusion "decreases" the effective size of the retainer-receiving opening provided by the occluded retainer aperture 19 to cause that partly occluded retainer-receiving opening to match more closely the size of the retainer lug to be inserted therein. Adaptor 13 is shaped to define, in whole or in part, a retainer-receiving opening that is different than the retainer-receiving opening defined by unoccluded retainer apertures 19 formed in rack 18.

It is within the scope of this disclosure to configure adaptor 13 to mount on rack 18 and to receive and mate with one or more retainer lugs included in a telescoping slide assembly, which lugs are not configured to be coupled normally to rack 18. Although many racks (like rack 18) feature square-shaped retainer apertures (like apertures 19), many retainers associated with telescoping slide assemblies are not designed to be mated with racks formed to include square-shaped apertures. An adaptor in accordance with the present disclosure may be coupled to, for example, a rack formed to include square-shaped apertures (or apertures having a first shape), and configured to receive and mate with non-square retainers (or retainers having a different second shape) so that a telescoping slide assembly including the retainers can be coupled to the rack using the adaptor.

Figures 4, 5:
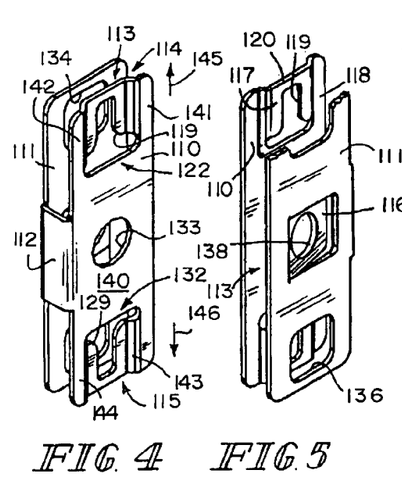
FIG. 4 is an enlarged perspective view of an illustrative adaptor configured to be mounted to a rack formed to include square-shaped apertures of the type shown in FIGS. 1–3 so as to mate with, for example, a slide support in a telescoping slide assembly in a manner shown, for example, in FIGS. 13–15.
FIG. 5 is another perspective view of the adaptor of FIG. 4.

In the illustrated embodiment, as suggested in FIG. 4, adaptor 13 includes a front wall 110, a rear wall 111 arranged to lie in spaced-apart relation to front wall 110, and a connector 112 arranged to interconnect front and rear walls 110, 111 to define a rack receiver channel 113 therebetween. As suggested in FIGS. 11 and 12, adaptor 13 is configured to receive a portion of rack 18 in rack receiver channel 113 when adaptor 13 is coupled to rack 18 to occlude portions of certain retainer apertures 19 (e.g., apertures 19a and 19c) formed in rack 18.

Figure 6:
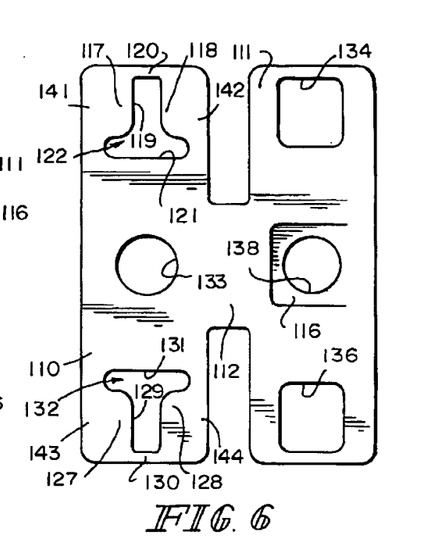
FIG. 6 is a view of an adaptor blank before it is folded to produce the adaptor shown in FIGS. 4 and 5.
Figure 7:
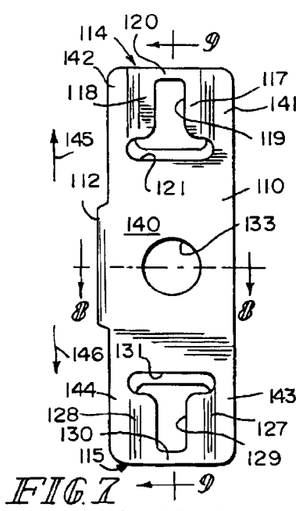
FIG. 7 is a front elevation view of the adaptor of FIG. 4.
Figure 8:
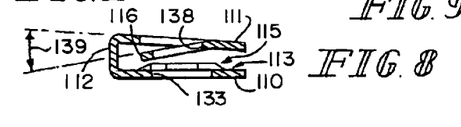
FIG. 8 is a sectional view taken along line 8—8 of FIG. 7.

First and second retainer receivers 114, 115 are coupled to front wall 110 as shown, for example, in FIGS. 4, 7, and 8 and configured to mate with retainer lugs 61, 62 as suggested, for example, in FIGS. 12–15. A tab 116 is coupled to rear wall 111 as shown, for example, in FIGS. 5, 6, 8, and 10.

In the illustrated embodiment, as suggested in FIGS. 12–15, when adaptor 13 is coupled to rack 18, first retainer receiver 114 extends into retainer aperture 19a, tab 116 extends into retainer aperture 19b, and second retainer receiver 115 extends into retainer aperture 19c to locate adaptor 13 in a selected position relative to rack 18. First retainer receiver 114 is sized, shaped, and located to reduce and/or alter the effective size of a retainer lug-receiving opening provided by retainer aperture 19a. Second retainer receiver 115 is sized, shaped, and located to reduce and/or alter the effective size of a retainer lug-receiving opening provided by retainer aperture 19c.

In an illustrative embodiment, adaptor 13 is made of a spring metal. Adaptor 13 can be "clipped" to rack 18 by spreading front and rear walls 110, 111 apart, inserting a portion of rack 18 in rack receiver channel 113, locating first retainer receiver 114 to occlude a portion of retainer aperture 19a (and, e.g., extend into retainer aperture 19a), locating tab 116 in confronting relation to retainer aperture 19b (to extend, e.g., into retainer aperture 19b), locating second retainer receiver 115 to occlude a portion of retainer aperture 19c (and, e.g., extend into retainer aperture 19c), and releasing front and rear walls 110, 111 so that the walls 110, 111 "snap" or otherwise move toward one another to engage forwardly and rearwardly facing surfaces 20, 22 of rack 18.

As suggested in FIGS. 4–7, in one illustrative embodiment, first retainer receiver 114 includes a vertically extending first side strip 117, a vertically extending second side strip 118 arranged to lie in spaced-apart relation to first side strip 117 to define a lug notch 119 therebetween. Also in the illustrative embodiment, a center strip 120 is included in first retainer receiver 114 and arranged to interconnect first ends of first and second side strips 117, 118 to form a U-shaped first retainer receiver 114. In the illustrative embodiment, outer portions of first and second side strips 117, 118 are angled as suggested in FIG. 4 to converge toward center strip 120 to cause center strip 120 to lie in offset relation to front wall 110 as suggested in FIG. 9.

Front wall 110 is formed to include a lateral notch 121 as shown, for example, in FIG. 6. Lateral notch 121 cooperates with lug notch 119 formed in first retainer receiver 114 to form a T-shaped opening 122 in adaptor 13.

As also suggested in FIGS. 4–7, in one illustrative embodiment, second retainer receiver 115 includes a vertically extending second side strip 128 arranged to lie in spaced-apart relation to first side strip 127 to define a lug notch 129 therebetween. Also in the illustrative embodiment, a center strip 130 is included in second retainer receiver 115 and arranged to interconnect first ends of first and second side strips 127, 128 to form a U-shaped second retainer receiver 115. In the illustrative embodiment, outer portions of first and second side strips 127, 128 are angled as suggested in FIG. 4 to converge toward center strip 130 to cause center strip 130 to lie in offset relation to front wall 110 as suggested in FIG. 9.

Front wall 110 is also formed to include a second lateral notch 131 as shown, for example, in FIG. 6. Lateral notch 131 cooperates with lug notch 129 formed in second retainer receiver 115 to form a T-shaped opening 132 in adaptor 13. Front wall 110 is also formed to include an anchor post retainer aperture 133 located about midway between T-shaped openings 122, 132 as shown, for example, in FIGS. 4, 6, and 7. Anchor post retainer aperture 133 is located to be aligned with retainer aperture 19b formed in rack 18 when adaptor 13 is coupled to rack 18 as suggested in FIGS. 11 and 12.

Rear wall 111 of adaptor 13 is formed to include a first retainer orifice 134 and a second retainer orifice 136 arranged to lie in spaced-apart relation to first retainer orifice 134 as suggested in FIG. 6. In the illustrated embodiment, tab 116 is located about midway between first and second retainer orifices 134, 136. Orifices 134, 136 may be formed to have any suitable shape and in the illustrated embodiment are shown to have a somewhat square shape with rounded corners. First retainer orifice 134 is located to be aligned with retainer aperture 19a formed in rack 18 and second retainer orifice 136 is located to be aligned with retainer aperture 19c formed in rack 18 when adaptor 13 is coupled to rack 18 as suggested, for example, in FIGS. 11, 12, 14, and 15.

Figures 9, 10:
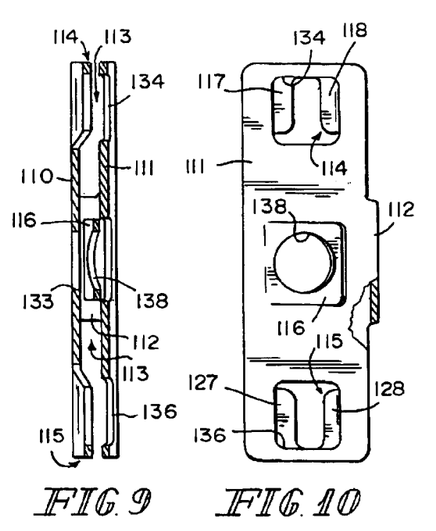
FIG. 9 is a sectional view taken along line 9—9 of FIG. 7.
FIG. 10 is a rear elevation view of the adaptor of FIG. 4 with a portion broken away.

Tab 116 is formed to include an anchor post retainer aperture 138 and is arranged to lie at an acute angle 139 relative to rear wall 111 as suggested, for example, in FIG. 8 to cause anchor post retainer aperture 138 to lie in confronting relation to and in registry with the anchor post retainer aperture 133 formed in front wall 110 as suggested, for example, in FIGS. 8 and 9. When adaptor 13 is coupled to rack 18, tab 116 is arranged to extend into retainer aperture 19b as suggested, for example, in FIG. 13 to align anchor post retainer aperture 138 formed in tab 116 with anchor post retainer aperture 133 formed in front wall 110 so that an anchor post 91 can extend through both apertures 133, 138 (as shown, for example, in FIGS. 14 and 15) when slide support 11 is coupled to adaptor 13 and rack 18.

As suggested in FIGS. 4 and 5, front wall 110 of adaptor 13 includes a body 140, a first pair of cantilevered extensions 141, 142 coupled to body 140, and a second pair of cantilevered extensions 143, 144 coupled to body 140. Extensions 141, 142 extend away from body 140 in a first direction 145 and extensions 143, 144 extend away from body 140 in an opposite second direction 146. Side strip 117 is coupled to extension 141, side strip 118 is coupled to extension 142, side strip 127 is coupled to extension 143, and side strip 128 is coupled to extension 144 as suggested in FIGS. 4 and 6.

Slide support 11 includes a slide support bracket 32 coupled to stationary slide 30. Slide support bracket 32 is formed to include a series of retainer apertures 33, 34, and 35, as suggested, for example, in FIGS. 3, 11, 12, and 13–15.

Figure 13:
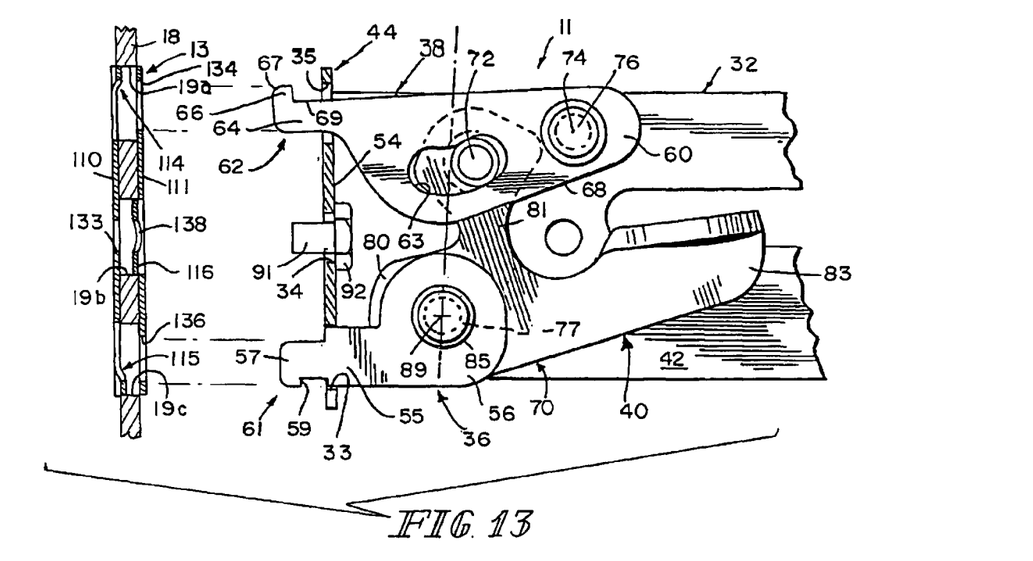
FIG. 13 shows a slide support before it is mated with the adapter mounted on the rack shown in FIG. 12.

As suggested in FIG. 13, slide support 11 further includes a fixed retainer 36 mounted in retainer aperture 33 and adapted to extend into retainer aperture 19c formed in rack 18 when slide support bracket 32 is mated to rack 18. Retainer lug 61 is included in fixed retainer 36.

Slide support 11 also includes a movable retainer 38 and a retainer mover linkage 40 configured to move movable retainer 38 between raised and lowered positions in a retainer passageway defined by aligned retainer apertures 19a, 35 (when operated by a technician) when slide support bracket 32 is mated to rack 18 so that slide support 11 can be coupled to and uncoupled from rack 18 quickly and easily in a manner suggested in FIGS. 12–15. Retainer lug 62 is included in movable retainer 38.

Slide support bracket 32 includes a slide mount portion 42 coupled to stationary slide 30 and a rack mount portion 44 arranged to lie at an angle to slide mount portion 42 as shown, for example, in FIGS. 11 and 12. Retainer apertures 33, 34, and 35 are formed in rack mount portion 44. A fastener 48 can be arranged to extend through apertures or position-adjustment slot 50 formed in slide mount portion 42 as suggested in FIG. 3 to engage stationary slide 30 so that slide support bracket 32 is mounted in a fixed position on one end of stationary slide 30. It is also within the scope of this disclosure to mount slide support bracket 32 in a fixed position on stationary slide 30.

Rack mount portion 44 includes a forwardly facing surface 52 and a rearwardly facing surface 54 as shown, for example, in FIGS. 11 and 12. Forwardly facing surface 52 of rack mount portion 44 is arranged to lie in confronting relation to rearwardly facing surface 22 of rack 18 to align retainer aperture 19a in rack 18 with the retainer aperture 35 formed in rack mount portion 44 to form a retainer passageway 19a, 35 extending from forwardly facing surface 30 of rack 18 to rearwardly facing surface 54 of rack mount portion 44 as shown, for example, in FIGS. 11 and 12. It is within the scope of this disclosure to place an intervening element between rack mount portion 44 and rack 18 so long as a retainer passageway 19a, 35 is provided to receive movable retainer 38 therein to anchor rack mount portion 44 to rack 18.

As shown best in FIG. 13, fixed retainer 36 includes a base 56 and a retainer lug 61 including a lug body 55 and a turned-out lug 57. In a mounted position on rack mount portion 44 of slide support bracket 32, base 56 is located to confront rearwardly facing surface 54 of rack mount portion 44 and retainer lug 61 is arranged to extend through retainer aperture 33 as shown, for example, in FIG. 14. When rack mount portion 44 is mated with rack 18, retainer lug 61 extends through retainer aperture 19c formed in vertical rack 18 as shown, for example, in FIGS. 14 and 15. Lug 57 includes a rearwardly facing surface 59 that is arranged to confront forwardly facing surface 20 of rack 18 and mate with front wall 110 of adaptor 13.

Figure 3:
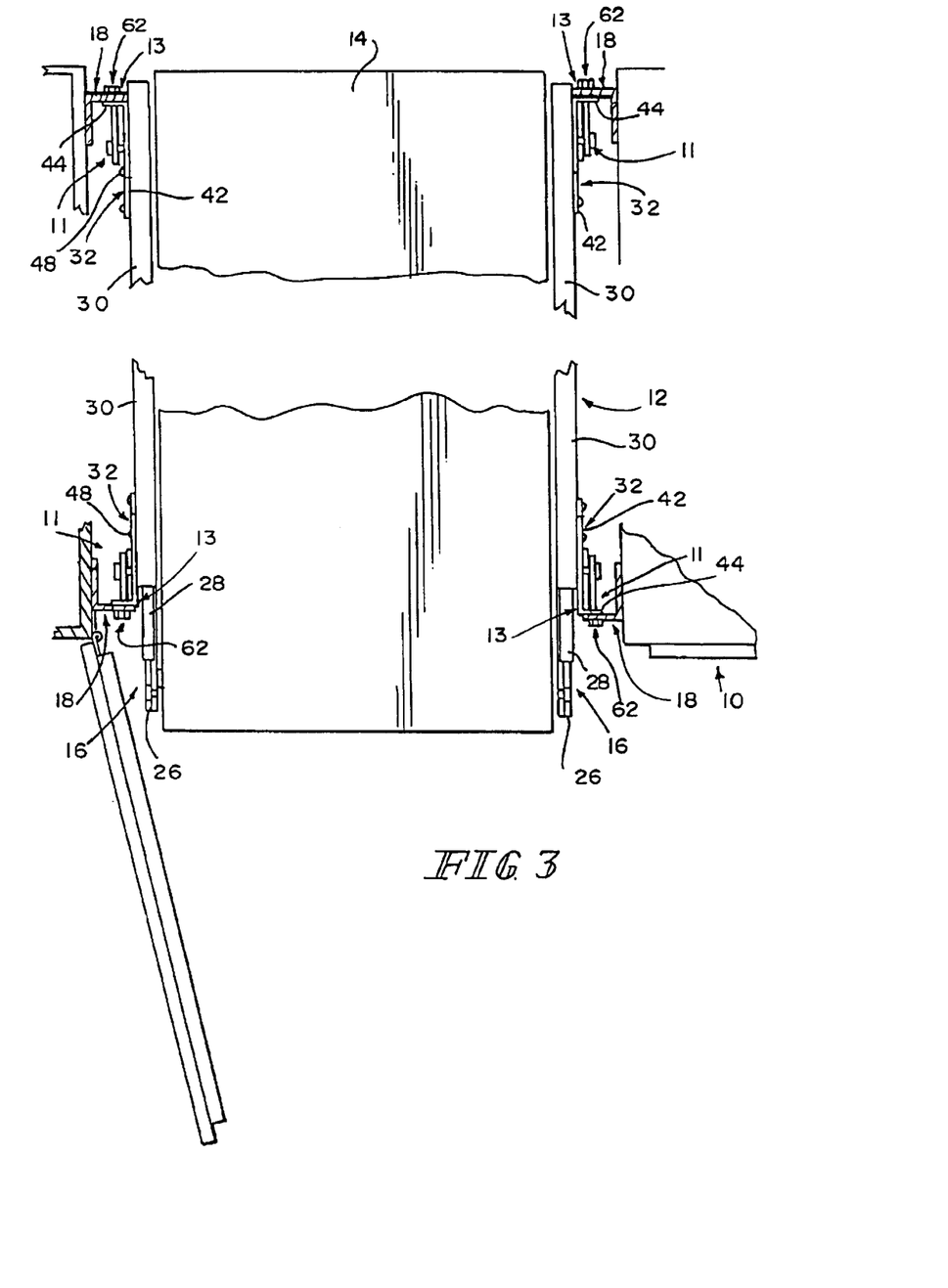
FIG. 3 is a sectional view taken along line 3—3 of FIG. 2 after the piece of equipment has been moved on the telescoping slide assemblies a short distance out of the cabinet showing a pair of spaced-apart three-part telescoping slide assemblies, a piece of equipment mounted therebetween, and four illustrative slide supports and showing that each slide support is coupled to an adaptor coupled to one of the forward and rearward vertical racks and coupled to a nearby portion of one of the telescoping slide assemblies to anchor the slide assemblies to the vertical racks.

As shown best in FIG. 3, movable retainer 38 includes a base 60, a retainer lug 62 including a lug body 64 and a lug head 66, and a mid-section 68 interconnecting base 60 and lug body 64. Retainer lug body 64 is sized to move into retainer passageway 19a, 35, 122, 134 during coupling and uncoupling of slide support 11 and rack 18 as suggested in FIGS. 12–15.

Figure 14:
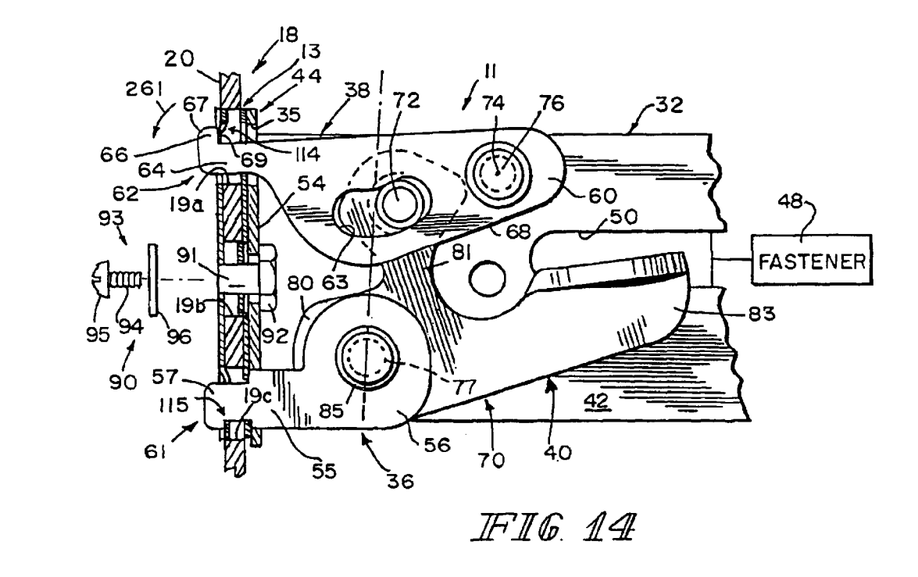
FIG. 14 shows the slide support of FIG. 13 during initial insertion of two retainer lugs included in the slide support into two retainer receivers formed in the adaptor.
Figure 15:
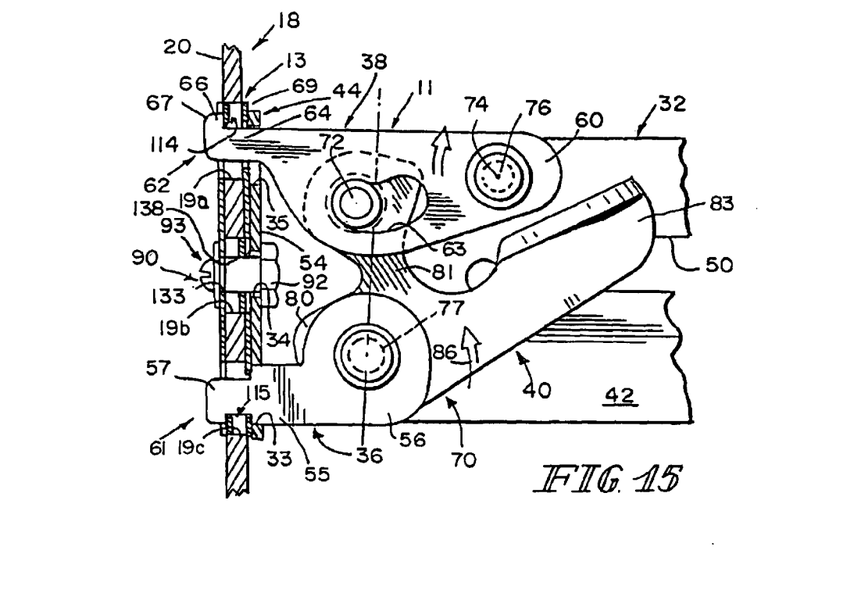
FIG. 15 shows the slide support of FIGS. 13 and 14 after pivoting movement of the upper retainer lug to retain the slide support in a position mated to the adaptor.

Retainer lug body 64 is also sized to move up and down in that retainer passageway 19a, 35, 122, 134 between a "lowered and unlocked position" shown, for example, in FIG. 14 and a "raised and locked position" shown, for example, in FIG. 15. In the lowered position, retainer lug 62 is arranged to pass into and out of its companion retainer passageway 19a, 35, 122, 134 easily under the control of a technician engaged in the business of coupling or uncoupling slide support 11 from a companion rack 18. In the raised position, a rearwardly facing surface 69 on lug head 66 is arranged to confront forwardly facing surface 20 of rack 18 (as suggested in FIG. 12 and to mate) to block movement of lug head 66 (and thus retainer lug 62 of movable retainer 38) through retainer passageway 19a, 35, 122, 134 so as to prevent uncoupling of slide support 11 and rack 18.

Lug head 66 is formed to include inclined cam surface 67. Inclined cam surface 67 is arranged to engage an edge formed on rack 18 to define retainer aperture 19a and to urge movable retainer 38 in a direction 261 (see FIG. 14) toward the lowered and unlocked position during movement of movable retainer 38 in retainer aperture 19a.

Retainer mover 40 is configured to be used by a technician to move retainer lug 62 quickly and easily to either its (1) lowered and unlocked position or (2) raised and locked position. In the illustrated embodiment, retainer mover 40 includes a movable actuator 70 and a driver pin 72 pivotably coupled to the movable actuator 70 and arranged to move in boomerang-shaped slot 63 formed in mid-section 68 of movable retainer 38 to cause movable retainer 38 to pivot about a retainer pivot axis 74 established by pivot mount 76 to move retainer lug body 64 in retainer passageway 19a, 35, 122, 134 between the (1) lowered and unlocked position and (2) the raised and locked position in response to movement of movable actuator 70 about a "floating" pivot axis 89 established, in part, by a deformable O-ring 77 mounted in an aperture formed in movable actuator 70. In the illustrated embodiment, deformable O-ring 77 constitutes the means for mounting the pivotable actuator for pivoting movement about the actuator pivot axis 89.

Although a deformable O-ring is used in the illustrated embodiment, any suitable deformable or resilient means may be used. Also, it is possible to eliminate deformable O-ring 77, and instead pivotally mount movable actuator 70 directly on anchor mount 85. Reference is hereby made to U.S. application Ser. No. 10/600,660, filed Jun. 20, 2003, which is hereby incorporated by reference herein for a more detailed description of O-ring 77 and the floating nature of pivot axis 89.

In the illustrated embodiment, pivot mount 76 is coupled to slide mount portion 42 of slide support bracket 32. Base 60 of movable retainer 38 is arranged to intercept retainer pivot axis 74 as suggested in FIG. 13.

As shown best in FIG. 13, movable actuator 70 includes a hub 80 formed to include O-ring receiver aperture (not shown) sized to receive O-ring 77, a driver arm 81 cantilevered to hub 80 and formed to include a driver pin aperture adapted to receive driver pin 72 therein, and a lever arm 83 cantilevered to hub 80 and shaped to be gripped by a user. Driver arm 81, hub 80, and lever arm 83 are arranged and shaped in the illustrated embodiment to cause movable actuator 70 to be somewhat Y-shaped.

A connector 90 is also included in slide support 11 of telescoping slide assembly 16 as suggested in FIGS. 12, 14, and 15 to anchor slide support bracket 32 to adaptor 13 and rack 18. In the illustrated embodiment, connector 90 includes anchor post 91, a first motion limiter 92 coupled to one end of anchor post 91, and a second motion limiter 93 configured to be coupled to an opposite end of anchor post 91. In the illustrated embodiment, second motion limiter 93 includes a bolt having a threaded shaft 94 and an enlarged head 95 and a washer 96. Shaft 94 is formed to extend into a threaded bore 97 formed in anchor post 91 as shown, for example, in FIG. 12. A rivet head or other enlarged member could be used to define the second motion limiter.

As shown best in FIG. 15, anchor post 91 extends from slide support bracket 32 through retainer orifice 34, apertures 133 and 138 in adaptor 13, and retainer aperture 19b in rack 18. First motion limiter 92 engages rack mount portion 44 of slide support bracket 32 and second motion limiter 93 engages front wall 110 of adaptor 13.

Figures 16, 17:
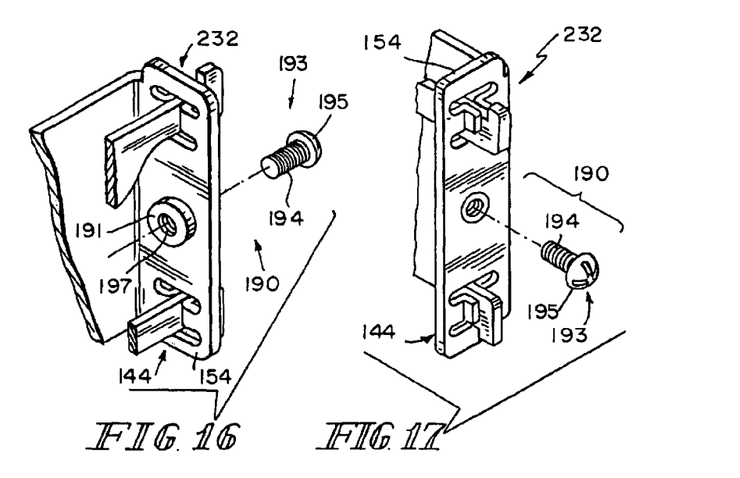
FIGS. 16 and 17 are perspective views of another slide support in accordance with the present disclosure.

A slide support bracket 232 in accordance with another embodiment of the disclosure is shown, for example, in FIGS. 16 and 17. In this embodiment, connector 190 includes an anchor post 191 coupled to rearwardly facing surface 154 of rack mount portion 144 to limit motion of anchor post 191 relative to slide support bracket 232. Anchor post 191 is formed to include a threaded bore 197. Connector 190 also includes a motion limiter 193 defined by a bolt having a threaded shaft 194 and an enlarged head 195. Shaft 194 is formed to extend into threaded bore 197. Connector 190 may be used as an alternative to connector 90 shown in FIGS. 12–15.

What is claimed is:

1. A telescoping slide assembly support system comprising a rack formed to include a series of retainer apertures, an adaptor including a retainer receiver formed to include a lug notch, the adaptor being coupled to the rack to position the retainer receiver to occlude a portion of a first of the retainer apertures, and a telescoping slide assembly including a stationary slide and a slide support coupled to the stationary slide, the slide support including a retainer lug arranged to extend through the first of the retainer apertures formed in the rack and through the lug notch formed in the adaptor to couple the slide support to the adaptor and align the slide support in a mounted position relative to the rack.

2. The system of claim 1, wherein the rack includes a forwardly facing surface, the adaptor includes a front wall coupled to the retainer receiver and arranged to contact the forwardly facing surface of the rack when the adaptor is coupled to the rack, and the retainer receiver is coupled to the front wall and arranged to extend into the first of the retainer apertures to locate the lug notch formed in the retainer receiver in the first of the retainer apertures.

3. The system of claim 2, wherein the front wall is formed to include a lateral notch that communicates with the lug notch formed in the retainer receiver to form a T-shaped opening in the adaptor.

4. The system of claim 3, wherein the slide support further includes a slide support bracket coupled to the stationary slide, the retainer lug is mounted for pivotable movement about a retainer pivot axis relative to the slide support bracket between a lowered and unlocked position disengaging the retainer receiver and a raised and locked position engaging the retainer receiver, and the retainer lug is arranged to extend into the lateral notch upon movement of the retainer lug to the lowered and unlocked position and to extend into the lug notch upon movement of the retainer lug to the raised and locked position.

5. The system of claim 2, wherein the rack includes a rearwardly facing surface, the adaptor includes a rear wall arranged to lie in spaced-apart relation to the front wall and formed to include a retainer orifice and a connector arranged to interconnect the front and rear walls to define a rack receiver channel therebetween, the rear wall is arranged to contact the rearwardly facing surface of the rack and align the retainer orifice of the rear wall in communication with the first of the retainer apertures formed in the rack when the adaptor is coupled to the rack and the rack extends into the rack receiver channel located between front and rear walls of the adaptor, and the retainer lug is arranged to extend through the retainer orifice of the rear wall of the adaptor.

6. The system of claim 5, wherein the retainer receiver includes a vertically extending first side strip, a vertically extending second side strip arranged to lie in spaced-apart relation to the vertically extending first side strip to define the lug notch therebetween, and the vertically extending first and second side strips are arranged to extend into the first of the retainer apertures when the adaptor is coupled to the rack.

7. The system of claim 1, wherein the retainer receiver includes a first side strip and a second side strip arranged to lie in spaced-apart relation to the first side strip to define the lug notch therebetween.

8. The system of claim 7, wherein the retainer receiver further includes a center strip coupled to first ends of the first and second side strips.

9. The system of claim 8, wherein the center strip and portions of the first and second strips extend into the first of the retainer apertures when the adaptor is coupled to the rack.

10. The system of claim 7, wherein portions of the first and second strips extend into the first of the retainer apertures when the adaptor is coupled to the rack.

11. The system of claim 7, wherein the adaptor further includes a front wall contacting a forwardly facing surface of the rack when the adaptor is coupled to the rack, the front wall includes a body, a first extension cantilevered to the body, and a second extension cantilevered to the body and arranged to lie in spaced-apart relation to the first extension to locate the retainer receiver therebetween, the first strip is coupled to the first extension, and the second strip is coupled to the second extension.

12. The system of claim 11, wherein the retainer receiver further includes a center strip coupled to the first and second side strips and the center strip is arranged to occlude another portion of the first of the retainer apertures.

13. The system of claim 1, wherein the adaptor includes a front wall coupled to the retainer receiver and arranged to contact the rack when the adaptor is coupled to the rack, the front wall is formed to include a lateral notch communicating with the lug notch to form a T-shaped opening in the adaptor.

14. The system of claim 13, wherein the rack includes a rectangle-shaped border edge defining the first of the retainer apertures, the retainer receiver includes a first side strip and a second side strip arranged to lie in spaced-apart relation to the first side strip to define the lug notch therebetween, and the first and second side strips are arranged to occlude a portion of the first of the retainer apertures.

15. The system of claim 1, wherein the retainer receiver includes a first side strip and a second side strip arranged to lie in spaced-apart relation to the first side strip to define the lug notch therebetween and the first and second side strips are arranged to occlude the portion of the first of the retainer apertures.

16. The system of claim 15, wherein the retainer receiver further includes a center strip coupled to the first and second side strips and the center strip is arranged to occlude another portion of the first of the retainer apertures.

17. A telescoping slide assembly support system comprising
a rack formed to include first, second, and third retainer apertures arranged in series,
an adaptor being coupled to the rack and including a first retainer receiver arranged to extend into the first retainer aperture and a second retainer receiver arranged to extend into the third retainer aperture, and
a telescoping slide assembly including a stationary slide, a first retainer arranged to extend through the first retainer receiver and the first retainer aperture and mounted for pivotable movement relative to the stationary slide about a retainer pivot axis, and a second retainer arranged to extend through the second retainer receiver and the third retainer aperture and coupled to the stationary slide.

18. The system of claim 17, wherein the adaptor is formed to include an anchor post retainer aperture arranged to lie in registry with the second retainer aperture formed in the rack when the first retainer receiver extends into the first retainer aperture and the second retainer receiver extends into the third retainer aperture.

19. The system of claim 18, wherein the adaptor includes a rear wall and a tab coupled to the rear wall to lie at an acute angle relative to the rear wall and the tab is formed to include the anchor post retainer aperture.

20. The system of claim 19, wherein the telescoping slide assembly further includes a slide support coupled to the stationary slide and to the first and second retainers and formed to include an anchor post retainer aperture, the adaptor further includes a front wall coupled to the first and second retainer receivers and an anchor post retainer aperture arranged to lie in registry with the second retainer aperture formed in the rack and the anchor post retainer aperture formed in the tab, and the telescoping slide assembly further includes an anchor post arranged to extend through the second retainer aperture and the anchor post retainer apertures formed in the slide support, tab, and front wall, a first motion limiter coupled to one end of the anchor post and arranged to engage the slide support, and a second motion limiter coupled to an opposite end of the anchor post to engage the front wall to anchor the slide support to the adaptor.

21. The system of claim 19, wherein the telescoping slide assembly further includes a slide support coupled to the stationary slide and to the first and second retainers and formed to include an anchor post retainer aperture, the adaptor further includes a front wall coupled to the first and second retainer receivers and an anchor post retainer aperture arranged to lie in registry with the second retainer aperture formed in the rack and the anchor post retainer aperture formed in the tab, and the telescoping slide assembly further includes an anchor post arranged to extend through the second retainer aperture and the anchor post retainer apertures formed in the slide support, tab, and front wall, the anchor post being coupled to the slide support to limit motion of the anchor post relative to the slide support, and a motion limiter coupled to one end of the anchor post to engage the front wall to anchor the slide support to the adaptor.

22. The system of claim 18, wherein the telescoping slide assembly further includes a slide support coupled to the stationary slide and to the first and second retainers and an anchor post extending from the slide support into the anchor post retainer formed in the adaptor and the second retainer aperture formed in the rack.

23. The system of claim 17, wherein each retainer receiver includes a first side strip and a second side strip arranged to lie in spaced-apart relation to the first side strip to define a notch, the first retainer extends through the notch associated with the first retainer receiver, and the second retainer extends through the notch associated with the second retainer receiver.

24. The system of claim 23, wherein the first and second side strips of the first retainer receiver are arranged to occlude a portion of the first retainer aperture and the first and second side strips of the second retainer receiver are arranged to occlude a portion of the third retainer aperture.

25. The system of claim 23, wherein the first retainer receiver further includes a center strip arranged to interconnect the first and second side strips of the first retainer receiver and the second retainer receiver further includes a center strip arranged to interconnect the first and second side strips of the second retainer receiver.

26. The system of claim 25, wherein the center strip of the first retainer receiver is arranged to occlude a portion of the first retainer aperture and the center strip of the second retainer receiver is arranged to occlude a portion of the third retainer aperture.

27. A telescoping slide assembly support system comprising a rack including a forwardly facing surface and a rearwardly facing surface and formed to include a series of retainer apertures extending between the forwardly and rearwardly facing surfaces, an adaptor including a front wall, a rear wall arranged to lie in spaced-apart relation to the front wall, a connector arranged to interconnect the front and rear walls to define a rack receiver channel therebetween receiving a portion of the rack therein, and a retainer receiver coupled to the front wall and formed to include a lug notch, the adaptor being coupled to the rack to mate the front wall with the forwardly facing surface and to mate the rear wall with the rearwardly facing surface and to align the retainer receiver in registry with a first of the retainer apertures to occlude a portion of the first of the retainer apertures, and a telescoping slide assembly including a stationary slide and a slide support coupled to the stationary slide, the slide support including a retainer lug arranged to extend through the first of the retainer apertures formed in the rack and the lug notch formed in the adaptor to couple the slide support to the adaptor and align the stationary slide and the slide support in a mounted position relative to the rack.

28. The system of claim 27, wherein the rack is formed to provide the first of the retainer apertures with a square shape and the retainer receiver is formed to provide the lug notch with a non-square shape that is smaller than the square shape of the first of the retainer apertures.

29. A telescoping slide assembly support system comprising a rack formed to include a series of square-shaped retainer apertures, an adaptor clipped to the rack and arranged to occlude a portion of a first of the square-shaped apertures to define a lug notch providing an inlet opening into the first of the square-shaped apertures, and a telescoping slide assembly including a stationary slide and a retainer lug mounted for movement relative to the stationary slide and arranged to extend through the lug notch and the first of the square-shaped aperture to align the stationary slide in a mounted position relative to the rack.

* * * * *